United States Patent [19]

Seki et al.

[11] Patent Number: 5,681,487

[45] Date of Patent: Oct. 28, 1997

[54] METHOD OF REMOVING PHOTORESIST FILM

[75] Inventors: Hitoshi Seki; Chisato Iwasaki; Akane Sekiya; Yasuhiko Kasama, all of Miyagi-ken; Tadahiro Ohmi, 1-7 Yukigaya, Otsuka-Cho, Ota-ku, Tokyo, all of Japan

[73] Assignees: Frontec Incorporated; Tadahiro Ohmi, both of Sendai, Japan

[21] Appl. No.: 499,538

[22] Filed: Jul. 7, 1995

[30] Foreign Application Priority Data

Jul. 14, 1994 [JP] Japan ................................. 6-162003

[51] Int. Cl.[6] ................................................. G03C 11/00
[52] U.S. Cl. ........................ 216/94; 216/83; 252/79.2; 252/79.1; 134/1
[58] Field of Search ................... 156/643.1; 252/79.2, 252/79.1; 134/1; 216/94, 83

[56] References Cited

U.S. PATENT DOCUMENTS

| | | | |
|---|---|---|---|
| 3,787,239 | 1/1974 | Schroeder et al. | 252/79.2 X |
| 3,900,337 | 8/1975 | Beck et al. | 252/79.2 X |
| 3,988,254 | 10/1976 | Mori | 252/79.2 X |
| 4,963,342 | 10/1990 | Lapham et al. | 252/79.2 X |
| 5,068,040 | 11/1991 | Jackson | 134/1 X |
| 5,269,850 | 12/1993 | Jackson | 134/1 X |
| 5,464,480 | 11/1995 | Matthews | 216/94 X |

FOREIGN PATENT DOCUMENTS 61-223838  10/1986  Japan .

*Primary Examiner*—Thi Dang
*Attorney, Agent, or Firm*—Guy W. Shoup; Patrick T. Bever

[57] ABSTRACT

The present invention provides a method of removing a photoresist film, which exhibits the high ability to remove photoresist and excellent safety and handling properties such as workability. In the removing method, the photoresist film is removed by chemical decomposition in an inorganic aqueous solution under ultraviolet-light irradiation. The inorganic aqueous solution is an aqueous solution of peroxomonosulfate or an aqueous solution containing 4.5 to 36 wt % of sulfuric acid and 0.05 to 0.8 wt % of hydrogen peroxide.

16 Claims, 4 Drawing Sheets

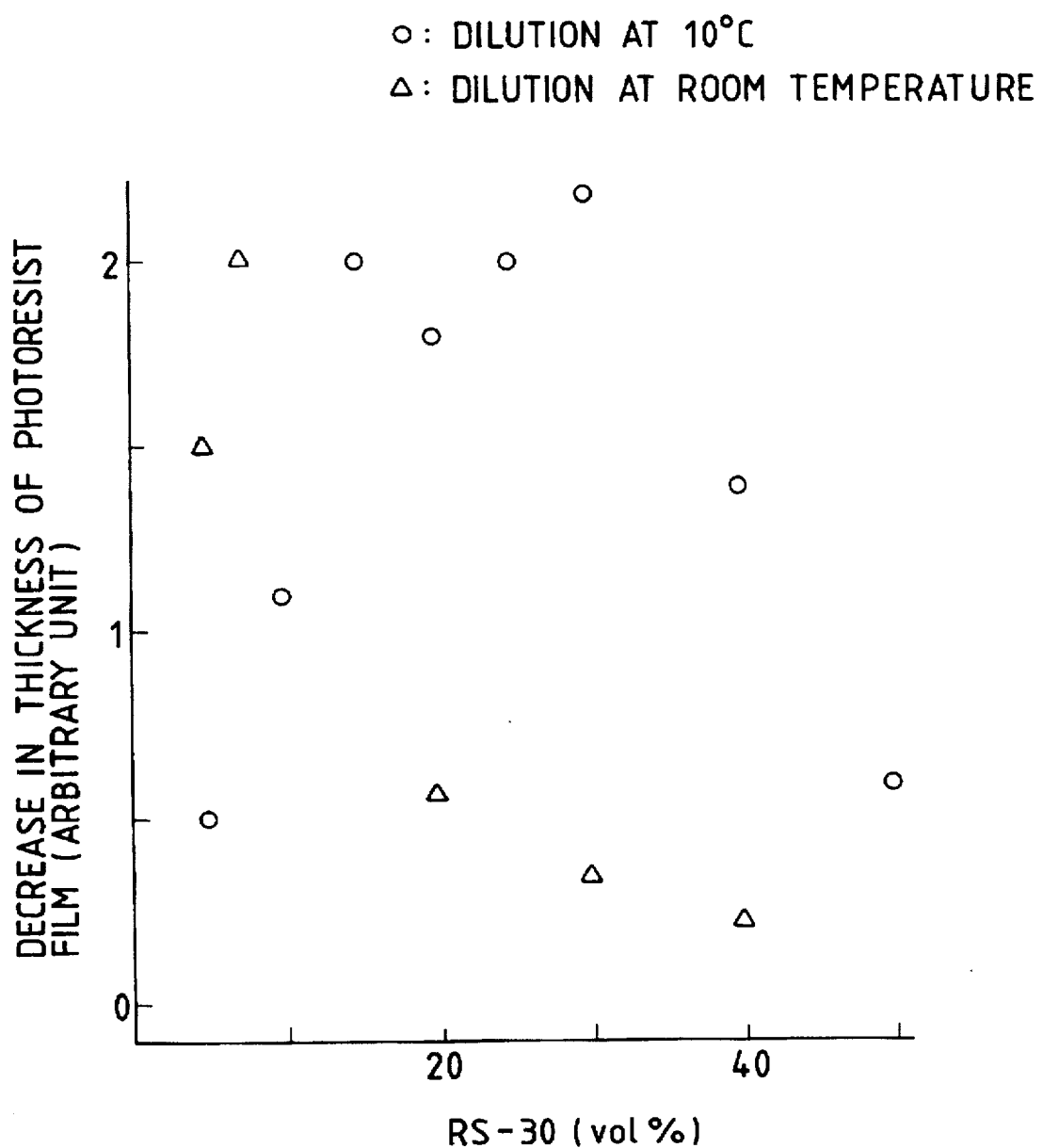

METHOD OF REMOVING PHOTORESIST FILM

BACKGROUND OF THE INVENTION

1. Field of the Invention

The present invention relates to a method of removing a photoresist film, and particularly to a method of removing a photoresist film using an inorganic solution which can easily be subjected to waste disposal, with high safety and excellent handling properties.

2. Description of the Related Art

Organic solvents such as tetramethylammonium hydroxide and the like, and inorganic solutions such as a mixture of sulfuric acid and hydrogen peroxide are currently used for removing photoresist in the process of manufacturing thin film transistor substrates for driving liquid crystals.

Although organic solvents have the advantages of high safety and good handling properties, as compared with acids, the ability of the organic solvents to remove photoresist is low due to the mechanism for removing photoresist by dissolving it, and the organic solvents thus have the problem of causing difficulties in stably and safely removing photoresist films.

Since, the disposal cost of organic waste water is higher than inorganic waste water, a process using the smallest amount of organic solvent possible is demanded for, particularly, the process of manufacturing thin film transistors for liquid crystals in which organic waste water accounts for 70% or more of total waste water in contrast with the semiconductor manufacturing process.

On the other hand, the method of removing resist by using an inorganic solution such as a mixture of sulfuric acid and hydrogen peroxide, which is a typical example, is characterized by its high decomposition rate and its ability to completely remove resist. However, since this method uses a solution at a high concentration (85% or more) and high temperature (50° C. or more), handling in the resist removing process and waste disposal are accompanied by danger, thereby causing the problems with respect to safety and handling properties. Since such an inorganic solution also has high corrosiveness in the form of a liquid or vapor, there is the restriction that peripheral containers and devices must be made of materials having high corrosion resistance. Thus, resist is possibly treated at a low concentration and low temperature in order to decrease the danger, corrosiveness, etc. However, this significantly deteriorates the ability to remove resist and is thus unpractical.

SUMMARY OF THE INVENTION

In the above situation, an object of the present invention is to provide a method of removing a photoresist film which has the high ability to remove photoresist and excellent safety and handling properties such as workability.

In order to achieve the object, the present invention comprises removing a photoresist film by decomposing it under ultraviolet-light irradiation in an inorganic aqueous solution.

The inorganic aqueous solution is an aqueous solution of peroxomonosulfate compound, preferably, at a concentration of 0.04 to 0.4 mol/l. The peroxomonosulfate compound is preferably $KHSO_5$ or $2KHSO_5 \cdot KHSO_4 \cdot K_2SO_4$.

The inorganic aqueous solution preferably contains 4.5 to 36 wt % of sulfuric acid and 0.05 to 0.8 wt % of hydrogen peroxide.

The present invention is preferably applied to photoresist comprising a novolak resin.

The inventors found in the progress of the development of inorganic aqueous solutions for removing photoresist with high workability and safety that irradiation with ultraviolet light causes decomposition of photoresist with an inorganic aqueous solution even at a low concentration which produces no decomposition, and increases the decomposition rate within a concentration range. The present invention has been achieved on the basis of this finding.

An inorganic aqueous solution containing peroxomonosulfate or sulfuric acid and hydrogen peroxide shows no function to decompose photoresist at a low concentration, and ultraviolet-light irradiation of an aqueous solution which does not contain such inorganic compounds causes no decomposition of photoresist. However, when an aqueous solution containing such compounds at low concentrations within a proper concentration range is irradiated with ultraviolet light, photoresist can be removed by chemical decomposition.

The concentration of peroxomonosulfate in such an inorganic aqueous solution is preferably 0.04 to 0.4 mol/l, and the mixture of sulfuric acid and hydrogen peroxide preferably contains 4.5 to 36 wt % $H_2SO_4$ and 0.05 to 0.8 wt % $H_2O_2$. The concentration of sulfuric acid is more preferably 4.5 to 27 wt %.

The inorganic aqueous solution of the present invention is a low concentration and thus exhibits less danger, good handling properties and the ease of waste disposal.

$KHSO_5$ is an example of the peroxomonosulfate, but composite salts such as a composite salt of potassium peroxomonosulfate-potassium sulfate ($2KHSO_5 \cdot KHSO_4 \cdot K_2SO_4$) and the like can also be used.

The ultraviolet light used in the present invention has a wavelength of 180 to 420 nm, preferably 200 nm or less. An irradiation power of at least 400W is preferably used.

The present invention can also further increase the resist decomposition rate by adding 0.2 mol/l of hydrochloric acid to the aqueous solution.

BRIEF DESCRIPTION OF THE DRAWINGS

FIG. 5 is a graph showing the relation between the decomposition rate of photoresist and the concentration of sulfuric acid/hydrogen peroxide.

DETAILED DESCRIPTION OF THE INVENTION

Figure 1:
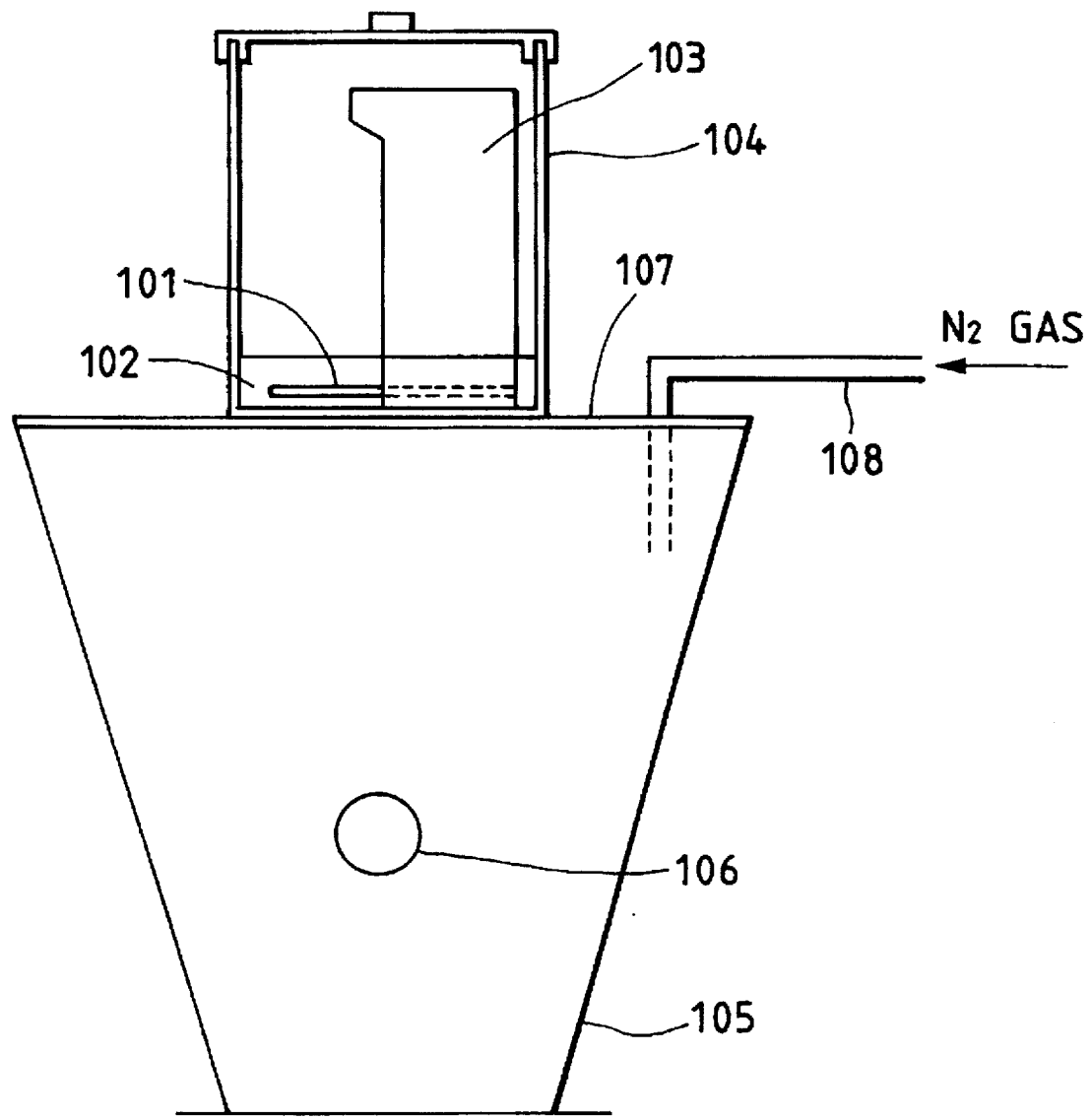
FIG. 1 is a conceptual view showing an example of devices for removing a photoresist film.

The present invention is described in further detail below with reference to examples.

EXAMPLE 1

A photoresist (produced by Tokyo-Oka, OFPR-800) was spin-coated on a 2-inch wafer, and then heated for 3 minutes in a nitrogen atmosphere at 130° C.

The wafer 101 coated with the resist was set in a wafer cassette 103 made of Teflon with the resist surface facing downward, and immersed in each of aqueous peroxomonosulfate solutions 102 at various concentrations, in a quartz beaker 104. The resist was removed by irradiating the wafer 101 with ultraviolet light from a 400-W ultraviolet lamp (produced by Toshiba Lightec, H400-P) 106 provided in a lamp house 105, and the relation between the concentration of peroxomonosulfate and the resist removal rate was examined. In this example, Oxone ($2KHSO_5 \cdot KHSO_4 \cdot K_2SO_4$) produced by Aldrich Co., Ld. was used as the peroxomonosulfate. The wafer cassette was not bottomed so as to applying light to the entire resist surface. Dry nitrogen gas was purged into the lamp house through a nitrogen inlet tube 108 so as not to heat the lamp house, and a cover 107 of the lamp house comprised a quartz plate so as to transmit ultraviolet light therethrough.

Figure 2:
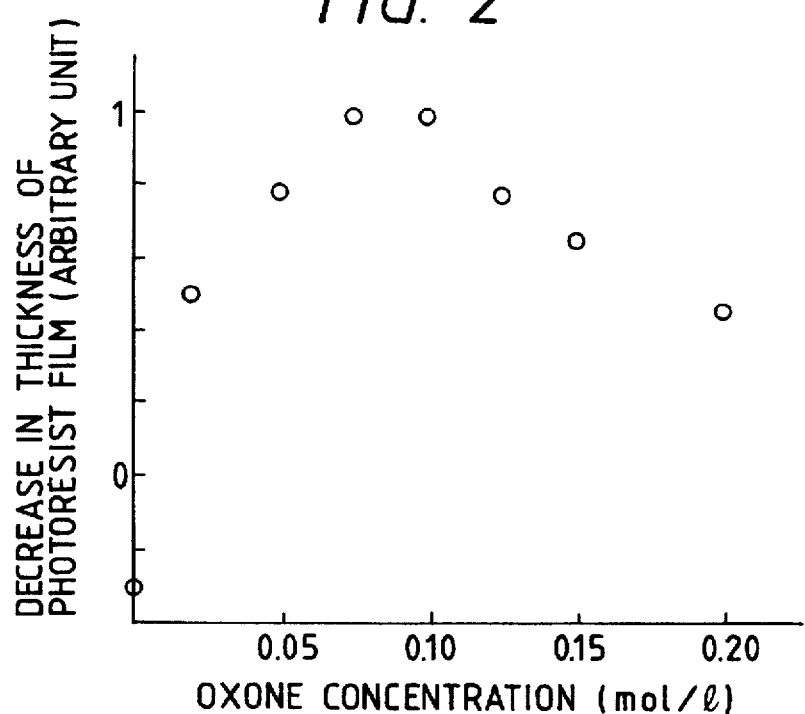
FIG. 2 is a graph showing the relation between the decomposition rate of photoresist and the concentration of peroxomonosulfate.

FIG. 2 shows the relation between the Oxone concentration and the decrease in thickness of the resist film. FIG. 2 reveals that the resist is decomposed and removed by adding Oxone, while the thickness of the resist film is inversely increased by irradiating an aqueous solution containing no Oxone with ultraviolet light. Particularly, it is found that a high decomposition rate is obtained at an Oxone concentration within the range of 0.02 to 0.2 mol/l (0.04 to 0.4 mol/l in terms of concentration of peroxomonosulfate).

Figure 3:
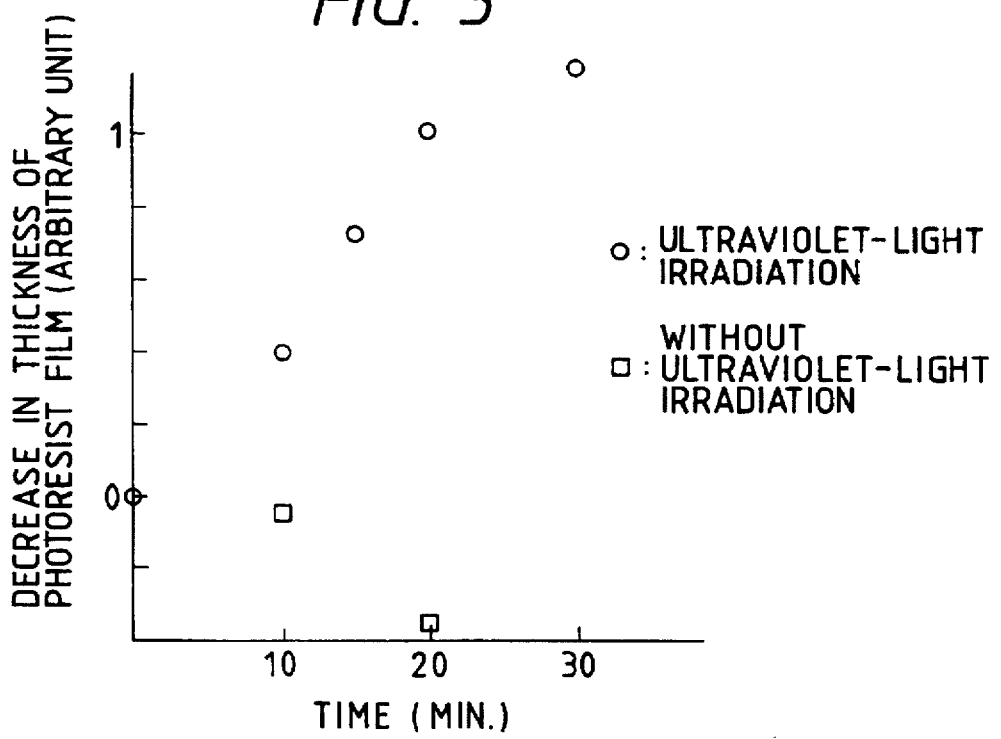
FIG. 3 is a graph showing changes in decrease in the thickness of a resist film with time.

FIG. 3 shows the results of examination of changes with time of the decrease in thickness of the resist film at an Oxone concentration of 0.05 mol/l with and without ultraviolet-light irradiation. Without ultraviolet-light irradiation, the examination was carried out using a solution heated to 60° C. or at room temperature.

FIG. 3 reveals that ultraviolet-light irradiation decreases the thickness of the resist film. On the other hand, without ultraviolet-light irradiation, the thickness of the resist film was inversely increased. Although the results of examination using a solution at room temperature of 25° C. are not shown in FIG. 3, the thickness was similarly increased. It is consequently found that the use of peroxomonosulfate alone causes swelling of the resist and thus has no effect of decomposing the resist.

As seen from FIGS. 2 and 3, a suitable decomposition rate of resist can be obtained by the synergistic effect of peroxomonosulfate and ultraviolet light.

EXAMPLE 2

A 0.05 mol/l Oxone solution (80 ml) was used as an inorganic aqueous solution. A decrease in thickness of the photoresist film was examined for a predetermined time by the same method as Example 1 except that various substances were added to the solution. The results obtained are shown in FIG. 4.

Figure 4:
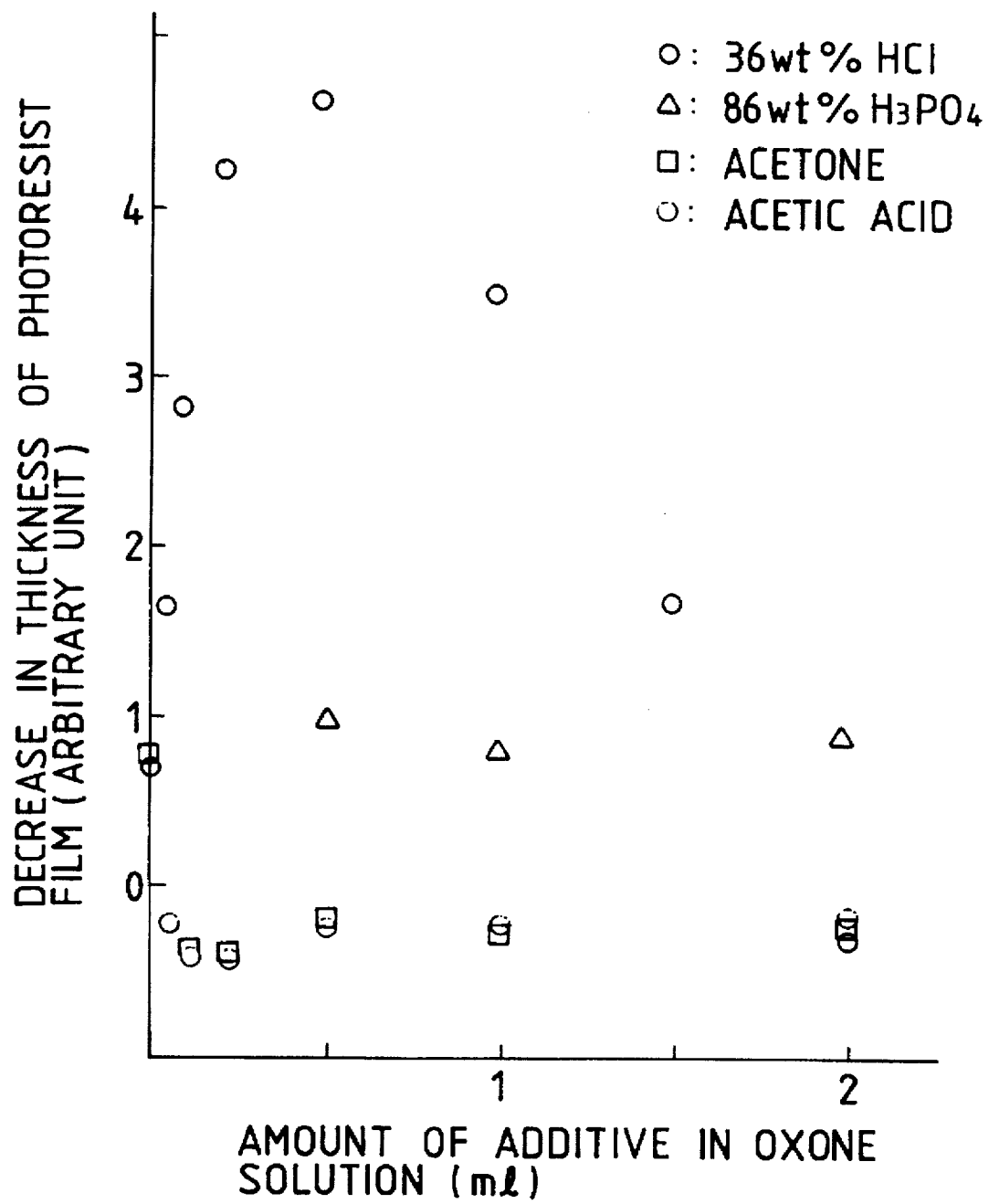
FIG. 4 is a graph showing effects of additives on the decomposition rate of photoresist.

FIG. 4 shows that the effect of decomposing the resist is eliminated by adding acetic acid, and the effect is hardly exhibited when phosphoric acid is added. On the other hand, the effect of decomposing the resist is significantly increased by adding hydrochloric acid within the range of 0.2 mol/l or less.

EXAMPLE 3

Experiment was carried out by the same method as Example 1 except that solutions containing sulfuric acid and hydrogen peroxide at various concentrations were used in place of the Oxone solution. In this example, a solution containing sulfuric acid and hydrogen peroxide produced by Rasa-kogyo Co., RS-30 (99 wt % sulfuric acid, 1 wt % hydrogen peroxide) was diluted with pure water, and hydrogen peroxide was then added to the diluted solution to prepare various concentrations of solutions.

An example of the results obtained is shown in FIG. 5. FIG. 5 shows the results of experiment using a RS-30 solution diluted at room temperature or 10° C. As seen from FIG. 5, the state of the resist decomposed depends upon the dilution temperature, and the peak of the decomposition rate is shifted by the dilution temperature. Although reasons for this are not yet apparent at present, a higher decomposition rate is obtained within the RS-30 content of 5 to 40 vol % (4.5 to 36 wt % sulfuric acid, 0.05 to 0.4 wt % hydrogen peroxide).

The same experiment was carried out using solutions prepared by combination of dilution and addition of sulfuric acid or hydrogen peroxide at various ratios of sulfuric acid or hydrogen peroxide. The results obtained showed that a higher rate of resist decomposition is obtained within the range of sulfuric acid of 4.5 to 36 wt % and the range of hydrogen peroxide of 0.05 to 0.8 wt %.

As a result of examination of the decomposition rate of resist by heating to 60° C. in place of irradiation with ultraviolet light, substantially no decomposition was observed.

The resist removing method of the present invention comprising immersing photoresist in an aqueous solution of peroxomonosulfate or a low-concentration aqueous solution containing sulfuric acid and hydrogen peroxide under irradiation with ultraviolet light can remove resist by decomposition, and improve the safety in the removal process and waste disposal process, thereby improving the handling properties.

The removing method of the invention can also decrease the total cost of manufacture including waste disposal due to the treatment with an inorganic aqueous solution.

What is claimed is:

1. A method of removing a photoresist film from a substrate comprising:

applying an inorganic aqueous solution onto the photoresist film; and irradiating the photoresist film with ultraviolet light;

wherein said inorganic aqueous solution is an aqueous solution of a peroxomonosulfate compound; and wherein the concentration of the peroxomonosulfate compound in said inorganic aqueous solution is 0.04 to 0.4 mol/l.

2. A method of removing a photoresist film according to claim 1, wherein said peroxomonosulfate compound is $2KHSO_5 \cdot KHSO_4 \cdot K_2SO_4$.

3. A method of removing a photoresist film according to claim 1, wherein 0.2 mol/l or less of hydrochloric acid is added to said inorganic aqueous solution.

4. A method of removing a photoresist film according to claim 3, wherein said photoresist comprises a novolak resin.

5. A method of removing a photoresist film according to claim 1, wherein said peroxomonosulfate compound is $2KHSO_5 \cdot KHSO_4 \cdot K_2SO_4$.

6. A method of removing a photoresist film from a substrate comprising:

immersing the substrate in an inorganic aqueous solution; and irradiating the immersed photoresist film with ultraviolet light such that the photoresist film is decomposed into the inorganic aqueous solution;

wherein said inorganic aqueous solution includes an aqueous solution of a peroxomonosulfate compound.

7. A method of removing a photoresist film according to claim 6, wherein the concentration of the peroxomonosulfate compound in said inorganic aqueous solution is 0.04 to 0.4 mol/l.

8. A method of removing a photoresist film according to claim 6, wherein said peroxomonosulfate compound is $2KHSO_5 \cdot KHSO_4 \cdot K_2SO_4$.

9. A method of removing a photoresist film according to claim 6, wherein 0.2 mol/l or less of hydrochloric acid is added to said inorganic aqueous solution.

10. A method of removing a photoresist film according to claim 6, wherein said photoresist comprises a novolak resin.

11. A method of removing a photoresist film from a substrate comprising:

applying an inorganic aqueous solution onto the photoresist film; and irradiating the photoresist film with ultraviolet light;

wherein said inorganic aqueous solution consists essentially of an aqueous solution of a peroxomonosulfate compound.

12. A method of removing a photoresist film according to claim 11, wherein said peroxomonosulfate compound is $2KHSO_5 \cdot KHSO_4 \cdot K_2SO_4$.

13. A method of removing a photoresist film according to claim 11, wherein said photoresist comprises a novolak resin.

14. A method of removing a photoresist film, comprising:

applying an inorganic aqueous solution onto the photoresist film; and irradiating the photoresist film with ultraviolet light;

wherein said inorganic aqueous solution consists essentially of an aqueous solution including 0.04 to 0.4 mol/l of peroxomonosulfate compound and 0.2 mol/l or less of hydrochloric acid.

15. A method of removing a photoresist film according to claim 14, wherein said peroxomonosulfate compound is $2KHSO_5 \cdot KHSO_4 \cdot K_2SO_4$.

16. A method of removing a photoresist film according to claim 14, wherein said photoresist comprises a novolak resin.

* * * * *

UNITED STATES PATENT AND TRADEMARK OFFICE
CERTIFICATE OF CORRECTION

PATENT NO.   : 5,681,487
DATED        : October 28, 1997
INVENTOR(S)  : Hitoshi Seki et al.

It is certified that error appears in the above-indentified patent and that said Letters Patent is hereby corrected as shown below:

In the Title Page

In column 2, line 4, under "ABSTRACT", replace ", In" with --. In--.

In the Claims

In Claim 4, line 2, replace "3" with --1--.

Signed and Sealed this

Eighth Day of December, 1998

Attest:

BRUCE LEHMAN

Attesting Officer

Commissioner of Patents and Trademarks